US011239632B2

United States Patent
Shen et al.

(10) Patent No.: US 11,239,632 B2
(45) Date of Patent: Feb. 1, 2022

(54) LASER DRIVING APPARATUS WITH CURRENT CONTROL CIRCUITRY AND MULTI-CHANNEL CIRCUITRY

(71) Applicant: Artilux, Inc., Menlo Park, CA (US)

(72) Inventors: Ding-Shiuan Shen, Hsinchu County (TW); Che-Fu Liang, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 0 days.

(21) Appl. No.: 16/885,314

(22) Filed: May 28, 2020

(65) Prior Publication Data
US 2020/0381891 A1 Dec. 3, 2020

Related U.S. Application Data

(60) Provisional application No. 62/878,752, filed on Jul. 26, 2019, provisional application No. 62/856,130, filed on Jun. 2, 2019.

(51) Int. Cl.
*H01S 5/0683* (2006.01)
*H01S 5/026* (2006.01)
(Continued)

(52) U.S. Cl.
CPC .......... *H01S 5/0261* (2013.01); *H01S 5/0428* (2013.01); *H01S 5/06* (2013.01); *H01S 5/06835* (2013.01)

(58) Field of Classification Search
CPC ..... H01S 5/042–0428; H01S 5/40–426; H01S 5/06216; H01S 5/06246; H01S 5/06808; H01S 5/06821; H01S 5/06835
See application file for complete search history.

(56) References Cited

U.S. PATENT DOCUMENTS 5,999,550 A * 12/1999 Bellemore .............. H01S 5/042
372/38.02
6,097,159 A * 8/2000 Mogi ...................... H01S 5/042
315/149
(Continued)

FOREIGN PATENT DOCUMENTS

CN 109802563 5/2019
CN 109802563 A 5/2019
(Continued)

OTHER PUBLICATIONS

Extended European Search Report for 20177788.5, dated Oct. 26, 2020, 14 pages.

*Primary Examiner* — Tod T Van Roy
(74) *Attorney, Agent, or Firm* — Dority & Manning, P.A.

(57) ABSTRACT

A laser driving apparatus includes a driver, a tracking circuit, a comparator and a control circuit. The driver includes a laser driving circuit, and the tracking circuit includes a reference current source and a replica circuit. The laser driving circuit generates a driving current to drive a laser. The reference current source generates a reference current as a reference for the laser driving apparatus. The replica circuit corresponds to at least a portion of the laser driving circuit, generates a sensing current according to the reference current and track the driving current. The comparator compares voltages respectively on the laser driving circuit and the replica circuit to generate a comparison signal. The control circuit adjusts the sensing current or the driving current according to the comparison signal. The laser driving apparatus can include multiple channels with multiple drivers.

19 Claims, 9 Drawing Sheets

(51) Int. Cl.
    *H01S 5/06*        (2006.01)
    *H01S 5/042*      (2006.01)

(56) References Cited

U.S. PATENT DOCUMENTS

| | | | |
|---|---|---|---|
| 7,369,591 B1 * | 5/2008 | Ziazadeh | H01S 5/042 |
| | | | 372/38.02 |
| 10,700,490 B2 * | 6/2020 | Soenen | H01S 5/042 |
| 2002/0122308 A1 * | 9/2002 | Ikeda | H01S 5/0427 |
| | | | 362/259 |
| 2004/0264522 A1 * | 12/2004 | Panikkath | H03K 5/151 |
| | | | 372/38.1 |
| 2005/0213623 A1 | 9/2005 | Ozasa | |
| 2005/0271099 A1 * | 12/2005 | Miremadi | H04B 10/504 |
| | | | 372/38.02 |
| 2006/0291512 A1 * | 12/2006 | Borschowa | H01S 5/0683 |
| | | | 372/38.02 |
| 2007/0153849 A1 * | 7/2007 | Koren | H01S 5/06808 |
| | | | 372/38.02 |
| 2010/0260219 A1 | 10/2010 | Daio | |
| 2018/0323567 A1 * | 11/2018 | Wada | H01S 3/06758 |
| 2020/0169064 A1 * | 5/2020 | Coy | H01S 5/06808 |

FOREIGN PATENT DOCUMENTS

| | | | |
|---|---|---|---|
| JP | 2008-243875 | * | 10/2008 |
| JP | 2012-38959 A | | 2/2012 |
| JP | 2012038959 | | 2/2012 |

* cited by examiner

LASER DRIVING APPARATUS WITH CURRENT CONTROL CIRCUITRY AND MULTI-CHANNEL CIRCUITRY

CROSS REFERENCE TO RELATED APPLICATIONS

This application claims the benefit of U.S. provisional application No. 62/856,130, which was filed on Jun. 2, 2019, and is included herein by reference. This application further claims the benefit of U.S. provisional application No. 62/878,752, which was filed on Jul. 26, 2019, and is included herein by reference.

BACKGROUND OF THE INVENTION

1. Field of the Invention

The present application is related to laser control, and more particularly, to a laser driving apparatus, for example, with current control circuitry, multi-channel circuitry, etc.

2. Description of the Prior Art

In a laser driving system, laser is driven by a driving current to emit the light. The driving current could be varied due to process, voltage or temperature, which may cause the driving capability problem during the operation. In order to detect the status of the laser driving current, typically a sensing circuit is equipped. However, sensing circuit has some problems to be solved, such as settling time, speed and sensing accuracy. In addition, the loading of the laser could be heavy and some other problems may occur during operation, such as signal reflection, parasitic inductance and parasitic capacitance.

SUMMARY OF THE INVENTION

It is therefore an objective of the present application to provide a laser driving apparatus, for example, with current control circuitry, multi-channel circuitry, etc., in order to solve the above-mentioned problems.

At least one embodiment of the present application provides a laser driving apparatus. The laser driving apparatus comprises a driver, a tracking circuit, a comparator and a control circuit. The driver comprises a laser driving circuit, and the tracking circuit comprises a reference current source and a replica circuit corresponding to at least a portion of the laser driving circuit, where the comparator is electrically coupled to the laser driving circuit and the replica circuit. The laser driving circuit is configured to generate a driving current to drive a laser, the reference current source is configured to generate a reference current as a reference for the laser driving apparatus, and the replica circuit has a scheme substantially the same as that of the laser driving circuit, and is configured to generate a sensing current according to the reference current, for tracking the driving current. Additionally, the comparator is configured to compare a first voltage on the laser driving circuit and a second voltage on the replica circuit to generate a comparison signal, and the control circuit is configured to adjust the sensing current or the driving current according to the comparison signal.

At least one embodiment of the present application provides a laser driving apparatus. The laser driving apparatus comprises a first channel and a second channel. For example, the first channel comprises a first resistor and a first driver, and is configured to generate a first driving signal according to a modulation signal. In addition, the second channel comprises a second resistor and a second driver, and is configured to generate a second driving signal according to the modulation signal. Additionally, the first resistor and the second resistor are coupled in parallel.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

One or more embodiments of the present disclosure are illustrated by way of example and not limitation in the figures of the accompanying drawings, in which like references may indicate similar elements, where the drawings are not necessarily drawn to scale.

DETAILED DESCRIPTION

Figure 1:
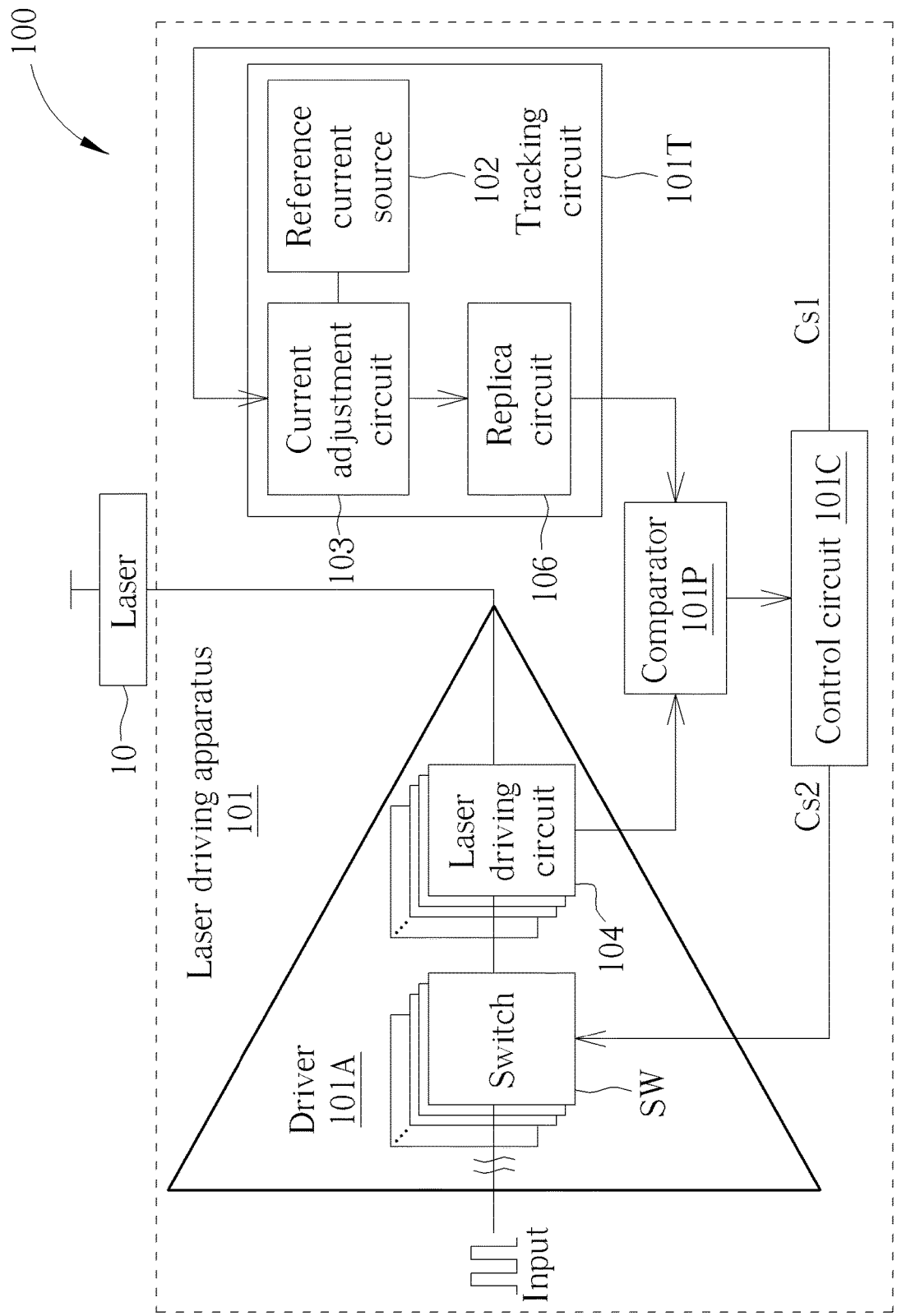
FIG. 1 is a light emitting apparatus according to an embodiment of the present application, where the light emitting apparatus comprises a laser and a laser driving apparatus having current control circuitry.

FIG. 1 is a light emitting apparatus 100 according to an embodiment of the present application, where the light emitting apparatus 100 comprises a laser 10 and a laser driving apparatus 101 having current control circuitry. The laser driving apparatus 101 comprises a driver 101A, a tracking circuit 101T, a comparator 101P and a control circuit 101C. The driver 101A comprises at least one laser driving circuit 104 (e.g., one or more laser driving circuits such as multiple laser driving circuits {104}) and at least one switch SW (e.g., one or more switches such as multiple switches {SW}), and the tracking circuit 101T comprises a reference current source 102, a current adjustment circuit 103 and a replica circuit 106 corresponding to at least a portion of the laser driving circuit 104. The comparator 101P is electrically coupled to the laser driving circuit 104 and the replica circuit 106, the control circuit 101C is electrically coupled to the comparator 101P, and at least the current adjustment circuit 103 and the switch SW are electrically coupled to the control circuit 101C to operate under control of the control circuit 101C. Based on the architecture shown in FIG. 1, the laser driving apparatus 101 is configured to perform current control for the laser 10, in order to achieve optimal performance of the light emitting apparatus 100.

Figure 2:
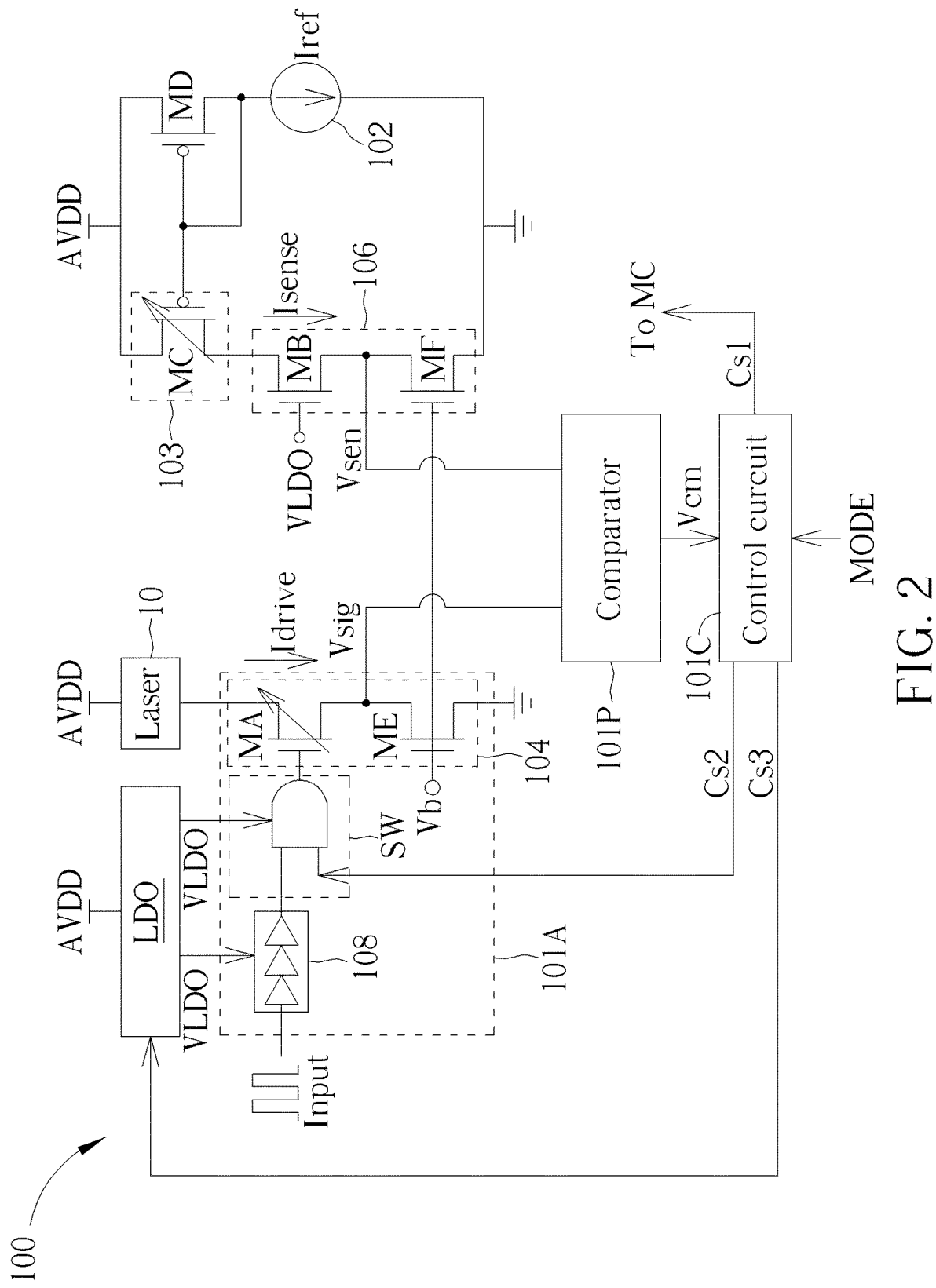
FIG. 2 illustrates some implementation details of the laser driving apparatus shown in FIG. 1 according to an embodiment of the present application.

FIG. 2 illustrates some implementation details of the laser driving apparatus 101 shown in FIG. 1 according to an embodiment of the present application. For better comprehension, some transistors such as Metal Oxide Semiconductor Field Effect Transistors (MOSFETs) can be utilized for implementing some components of the laser driving apparatus 101 shown in FIG. 1. As shown in FIG. 2, in addition to the switch SW and the laser driving circuit 104, the driver 101A further comprises a phase delay circuit 108. In the driver 101A, the switch SW comprises an AND gate, and the laser driving circuit 104 comprises transistors MA and ME that are electrically coupled to each other, where the transistor ME can operate based on a bias voltage Vb. In addition, the laser driving apparatus 101 shown in FIG. 1 further comprises a low-dropout regulator LDO as shown in the upper left of FIG. 2, where the low-dropout regulator LDO is configured to regulate a voltage AVDD to generate a regulated voltage VLDO, for providing power to the driver 101A. In some implementations, the phase delay circuit 108 and the switch SW of the driver 101A are electrically coupled to the low-dropout regulator LDO for receiving the regulated voltage VLDO.

As shown in the upper right of FIG. 2, the tracking circuit 101T is implemented by way of a current mirror. The current mirror comprises a transistor MD electrically coupled to the reference current source 102. The transistor MD and the reference current source 102 are positioned on a first current path of the current mirror. The current adjustment circuit 103 and the replica circuit 106 are positioned on a second current path of the current mirror. For example, a reference current Iref generated by the reference current source 102 can flow through the first current path, and a sensing current Isense can flow through the second current path, where the reference current Iref can be a precise reference current, and more particularly, can be generated according to an off-chip resistor and/or build-in band-gap device. The current adjustment circuit 103 of the tracking circuit 101T comprises at least one transistor MC (e.g., one or more transistors such as multiple transistors {MC}), and the replica circuit 106 comprises at least one set of transistors (e.g., one or more sets of transistors) coupled between the current adjustment circuit 103 and the ground, such as a set of transistors including transistors MB and MF that are electrically coupled to each other, where the transistor MF of this set of transistors can also operate based on the bias voltage Vb.

According to this embodiment, the laser driving circuit 104 is configured to generate a driving current Idrive to drive the laser 10. The reference current source 102 is configured to generate the reference current Iref as a reference for the laser driving apparatus 101. In one embodiment, the replica circuit 106 has a scheme substantially the same as the laser driving circuit 104 and is configured to generate the sensing current Isense according to the reference current Iref for tracking the driving current Idrive. In addition, the comparator 101P is configured to compare a first voltage Vsig on the laser driving circuit 104 (e.g., the first voltage Vsig on the node between the transistors MA and ME therein) and a second voltage Vsen on the replica circuit 106 (e.g., the second voltage Vsen on the node between the transistors MB and MF therein) to generate a comparison signal Vcm. The control circuit 101C is configured to adjust the sensing current Isense or the driving current Idrive according to the comparison signal Vcm. For example, the control circuit 101C can be configured to adjust the driving current Idrive in a calibration mode of the laser driving apparatus 101. For another example, the control circuit 101C can be configured to adjust the sensing current Isense in a detection mode of the laser driving apparatus 101.

As shown in FIG. 2, the replica circuit 106 has circuit architecture substantially the same as or similar to at least one portion (e.g., a portion or all) of the laser driving circuit 104. For example, the transistors MB and MF within the replica circuit 106 can be the same as the transistors MA and ME within the laser driving circuit 104, respectively, where the connections of the replica circuit 106 can be the same as the connections of the laser driving circuit 104.

As the transistor MC is positioned on a current path of the replica circuit 106, such as the second current path of the current mirror mentioned above, the transistor MC can be configured to perform current adjustment on the sensing current Isense. Specifically, the control circuit 101C is configured to generate a first adjusting signal Cs1 to control the transistor MC so as to adjust the sensing current Isense. In one implementation, the current adjustment circuit 103 comprises a transistor bank having multiple transistors {MC}, and multiple switches can be integrated into the transistor bank, for enabling or disabling the multiple transistors {MC} (more particularly, respective current paths thereof) between the voltage AVDD and the replica circuit 106 according to the first adjusting signal Cs1. As the respective current paths of the multiple transistors {MC} can be regarded as multiple sub-paths of the second current path of the current mirror, and as the switches of the transistor bank can enable or disable these sub-paths of the second current path of the current mirror, respectively, the control circuit 101C can utilize the first adjusting signal Cs1 to control the number of enabled transistors among the multiple transistors {MC} to adjust the sensing current Isense.

In addition, as the transistor MA is positioned on a current path of the laser driving circuit 104, such as a current path from the laser 10 to the ground, the transistor MA can be configured to perform current adjustment on the driving current Idrive. Specifically, the control circuit 101C is configured to generate a second adjusting signal Cs2 to control the transistor MA (e.g., through the AND gate in the switch SW) so as to adjust the driving current Idrive. As shown in the upper left of FIG. 2, the transistor MA (e.g., the gate terminal) is electrically coupled to the switch SW, where the switch SW can be configured to control the transistor MA according to the second adjusting signal Cs2 so as to adjust the driving current Idrive. In one implementation, the driver 101A can be implemented to comprise a driving circuit bank formed with the multiple laser driving circuits {104}, and the respective input terminals of the multiple laser driving circuits {104} (e.g., the respective gate terminals of the transistors {MA} therein) can be electrically coupled to the multiple switches {SW}, where the multiple switches {SW} can enable or disable the multiple transistors {MA} (more particularly, respective current paths thereof) between the laser 10 and the ground under control of the second adjusting signal Cs2, respectively.

Additionally, the control circuit 101C is configured to generate a third adjusting signal Cs3 to control the low-dropout regulator LDO so as to adjust the driving current Idrive. For example, the control circuit 101C can adjust the voltage level of the regulated voltage VLDO through the third adjusting signal Cs3. As shown in FIG. 2, the switch SW is supplied by the regulated voltage VLDO, and this configuration caps the highest voltage level of the output of the switch SW at the regulated voltage VLDO, and therefore can affect the voltage generated on the gate terminal of the transistor MA and change the driving capability of the transistor MA. As such, the driving current Idrive can be adjusted by controlling the voltage level of the regulated voltage VLDO through the third adjusting signal Cs3.

Please note that the phase delay circuit 108 is configured to control the phase delay of an input signal Input of the driver 101A. In one embodiment, the input signal Input can be a modulation signal and inputted into the laser driving circuit 104 through the phase delay circuit 108 and the switch SW. In one implementation, the input signal Input can be a clock signal or continuous pulse signal. In one implementation, the control circuit 101C can be a digital circuitry. In one implementation, the laser 10 can be a vertical-cavity surface-emitting laser (VCSEL). Furthermore, according to some embodiments, the laser driving apparatus 101 can operate in any mode of at least two modes such as the detection mode and the calibration mode.

Figure 3:
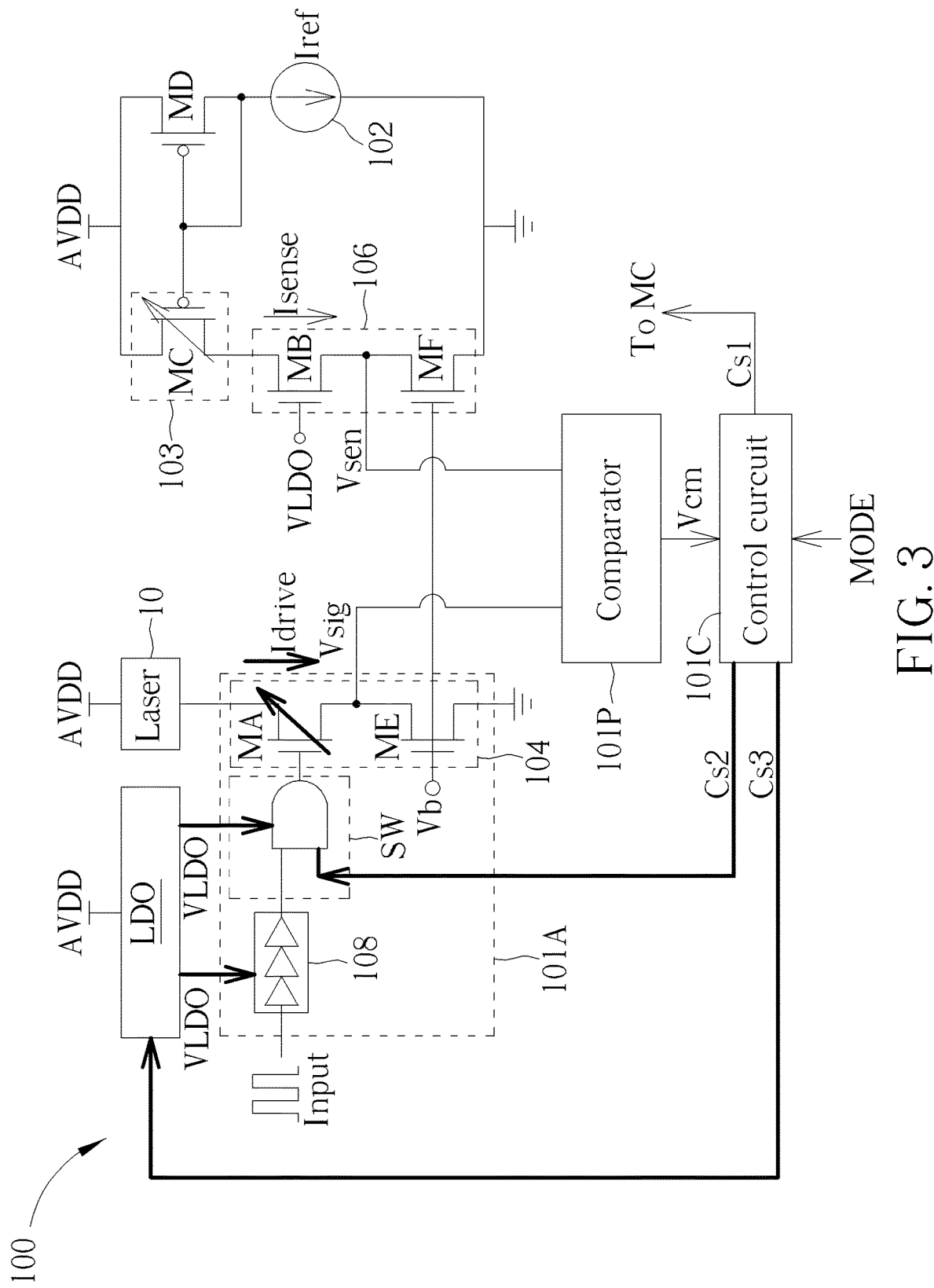
FIG. 3 illustrates the laser driving apparatus shown in FIG. 1 that is operated under a calibration mode.
Figure 4:
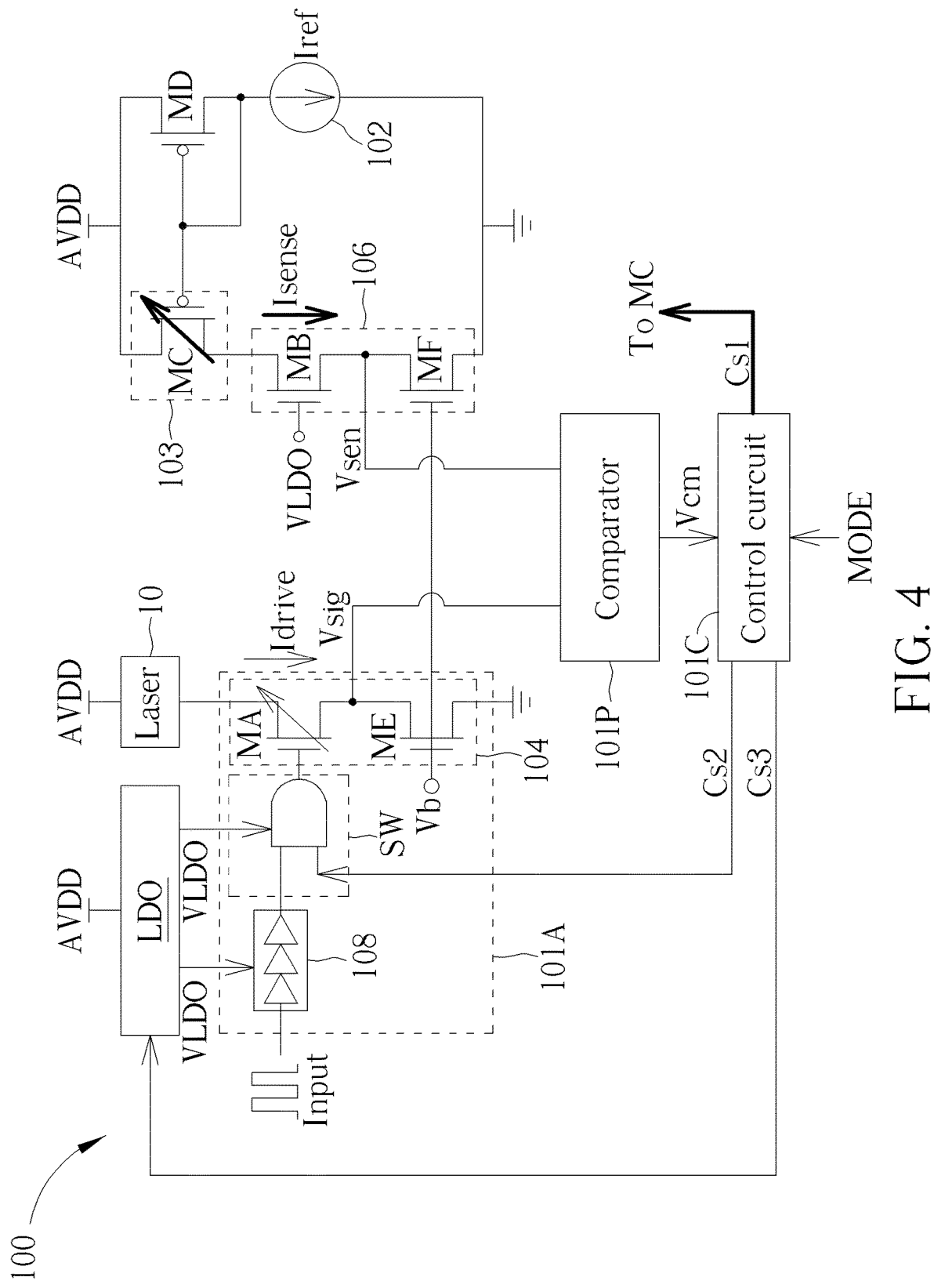
FIG. 4 illustrates the laser driving apparatus shown in FIG. 1 that is operated under a detection mode.

FIG. 3 illustrates the laser driving apparatus 101 operating in the calibration mode. FIG. 4 illustrates the laser driving apparatus 101 operating in the detection mode. The arrows with bold lines indicate the associated adjustments (e.g., the adjustment paths, the adjusted components, the adjusted signals such as voltages and currents). According to some embodiments, the laser driving apparatus 101 is configured to detect and calibrate the driving current Idrive and utilize the driving current Idrive to drive the laser 10. The comparator 101P is configured to compare the two input signals (e.g., the first voltage Vsig and the second voltage Vsen) to generate the comparison signal Vcm. The control circuit 101C is configured to generate multiple current adjusting signals such as the first adjusting signal Cs1, the second adjusting signal Cs2 and third adjusting signal Cs3 according to the mode signal MODE and the comparison signal Vcm, where the mode signal MODE is configured to control the control circuit 101C to operate in a selected mode (e.g., detection mode, calibration mode or any other modes).

In the detection mode, the laser driving apparatus 101 is configured to generate the sensing current Isense by tracking the driving current Idrive. As shown in FIG. 4, in the detection mode, the current adjusting signals (e.g., the second and the third adjusting signals Cs2 and Cs3) corresponding to the driving current Idrive are fixed, and the current adjusting signal (e.g., the first adjusting signal Cs1) corresponding to the sensing current Isense is configured to control the transistor MC to dynamically adjust the sensing current Isense until the two input signals (e.g., the first voltage Vsig and the second voltage Vsen) of the comparator 101P are substantially the same. When the two input signals (e.g., the first voltage Vsig and the second voltage Vsen) of the comparator 101P are substantially the same, the control circuit 101C has a settled current adjusting signal (e.g., the first adjusting signal Cs1) corresponding to the sensing current Isense, where the settled current adjusting signal can be represented by a digital code. As a result, the driving current Idrive can be obtained based on the settled current adjusting signal (e.g., the first adjusting signal Cs1). In other words, the driving current Idrive can be represented by this digital code. In addition, the laser driving apparatus 101 can use digital loop to detect the driving current Idrive.

Assume the respective transistor sizes $MA_S$, $MB_S$, $MC_S$ and $MD_S$ (e.g., aspect ratios) of the transistors MA, MB, MC and MD have the relationships of $MA_S:MB_S=N_S:1$ and $MC_S:MD_S=M_S:1$, and then the relationships between the driving current Idrive, the sensing current Isense and the reference current Iref can be expressed with Equation (1) as below:

$$Idrive = Isense*N_S = Iref*M_S*N_S \qquad (1);$$

where $M_S$ and $N_S$ are positive values.

In the calibration mode, laser driving apparatus 101 is configured to calibrate the driving current Idrive according to the sensing current Isense. As shown in FIG. 3, in the calibration mode, the current adjusting signal (e.g., the first adjusting signal Cs1) corresponding to the sensing current Isense is fixed, and the current adjusting signals (e.g., the second and the third adjusting signals Cs2 and Cs3) corresponding to the driving current Idrive are configured to control the switch SW (e.g., the switch circuit such as the AND gate) and the low-dropout regulator LDO respectively so as to adjust the driving current Idrive until the two input signals (e.g., the first voltage Vsig and the second voltage Vsen) of the comparator 101P are substantially the same. The driving current Idrive can be adjusted by the aspect ratio of transistor MA (e.g., by way of selecting the number of enabled transistors among the transistors {MA} of the multiple laser driving circuits {104}) and/or the regulated voltage VLDO. For example, the control circuit 101C can control one or both of the switch SW (e.g., the AND gate) and the low-dropout regulator LDO, to change the driving current Idrive.

As shown in FIG. 3 and FIG. 4, the laser driving apparatus 101 has the flexibility to operate under the detection mode or the calibration mode. Under the detection mode, the laser driving apparatus 101 is configured to detect the driving current Idrive; and under the calibration mode, the laser driving apparatus 101 is configured to calibrate the driving current Idrive. In comparison with an analog sensing loop, the laser driving apparatus 101 utilizes digital sensing loop to reduce the settling time and therefore can be used in high frequency modulation signal. In addition, in the calibration mode, the laser driving apparatus 101 has some current adjustment options, and more particularly, can calibrate the driving current Idrive by controlling the transistor MA and/or by controlling the low-dropout regulator LDO.

Figure 5:
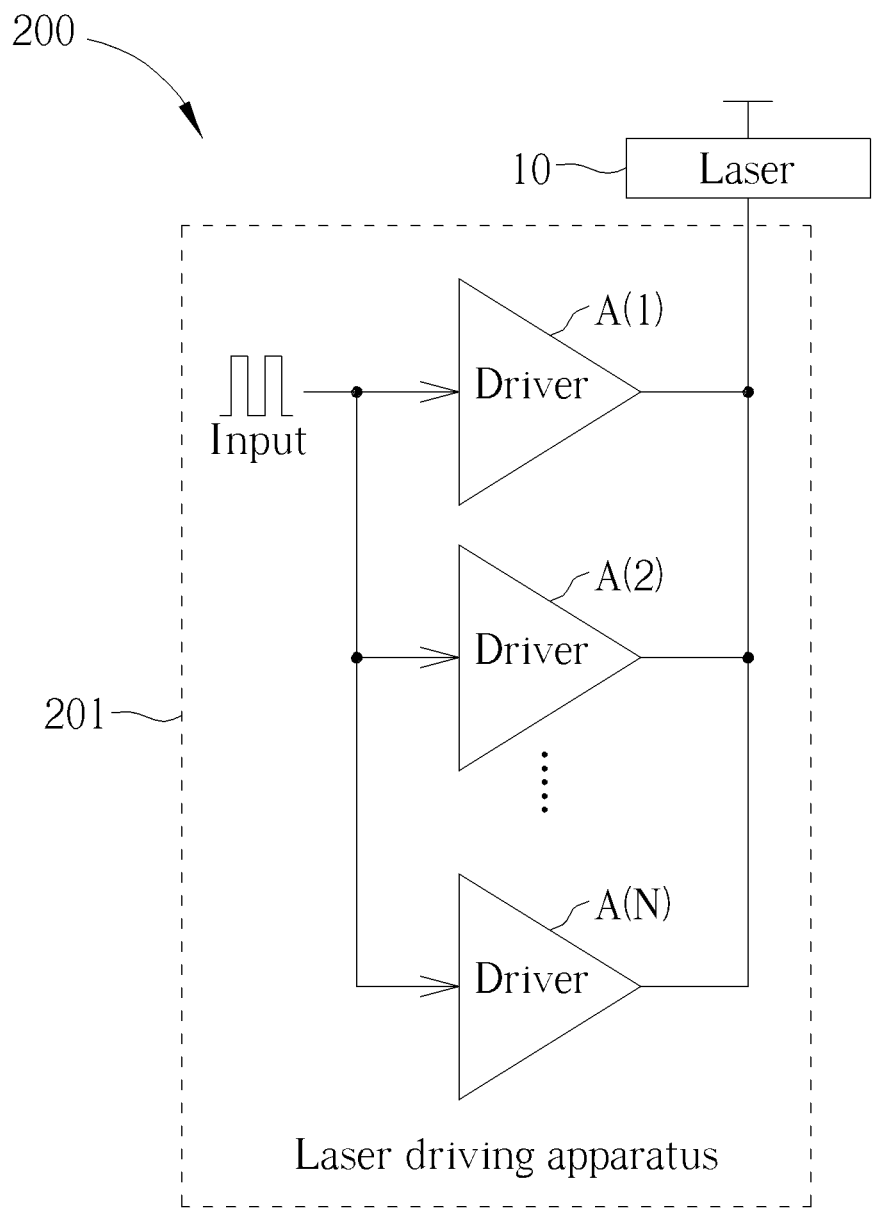
FIG. 5 is a light emitting apparatus according to an embodiment of the present application.

FIG. 5 is a light emitting apparatus 200 according to an embodiment of the present application. The light emitting apparatus 200 comprises the laser 10 and a laser driving apparatus 201 having multi-channel circuitry, where the laser driving apparatus 201 comprises multiple drivers A(1), A(2), . . . and A(N) to form multiple channels (e.g., N channels, where N is a positive integer and greater than one). For example, any driver (e.g., each driver) of the multiple drivers A(1), A(2), . . . and A(N) can be implemented according to the driver 101A, and more particularly, the driver can use the same circuit architecture and the same functionality as the driver 101A.

Figure 6:
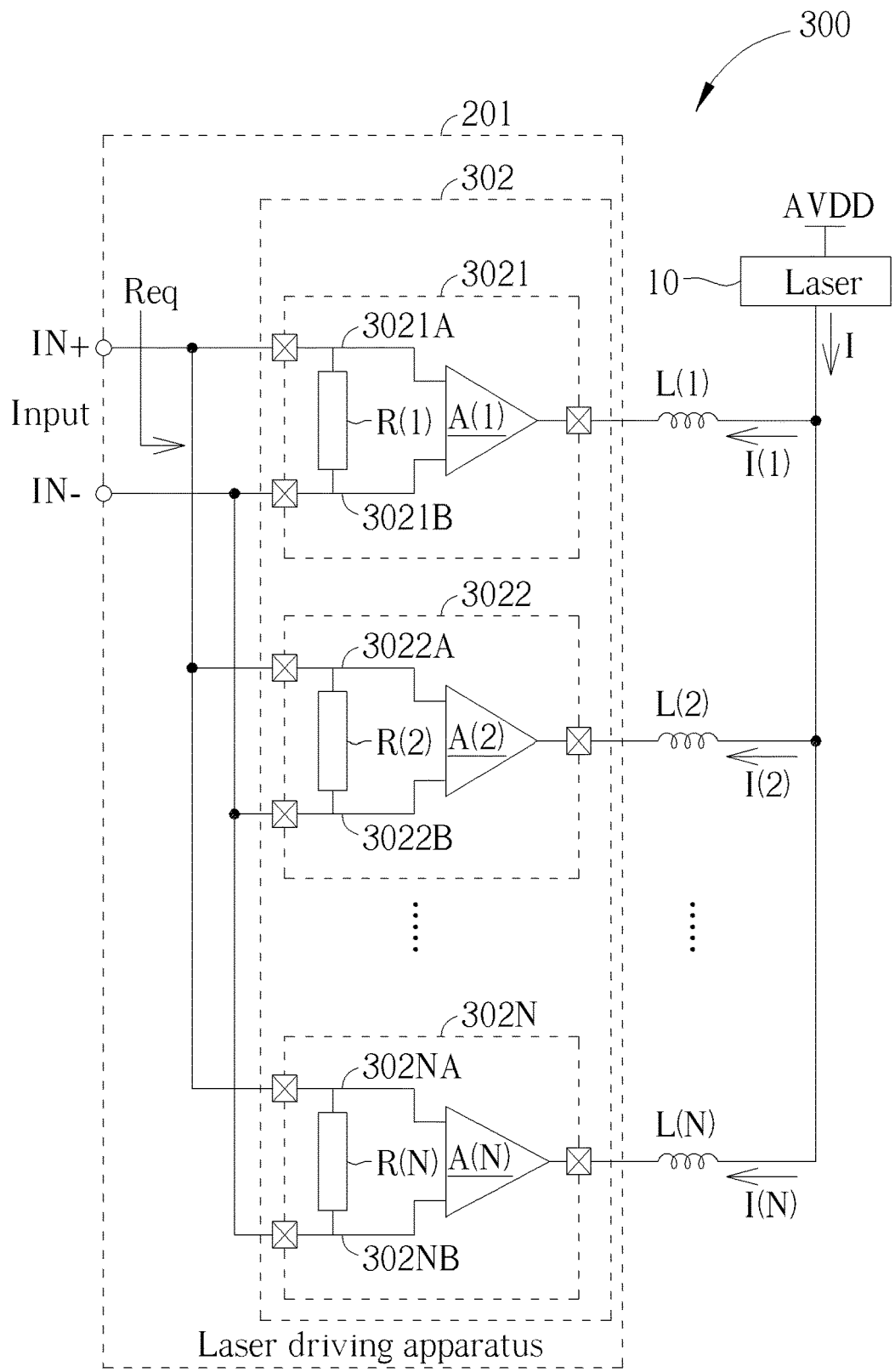
FIG. 6 is a light emitting apparatus according to an embodiment of the present application.

FIG. 6 is a light emitting apparatus 300 according to an embodiment of the present application. The light emitting apparatus 300 can be viewed as an example of the light emitting apparatus 200 shown in FIG. 5. The laser driving apparatus 201 of this embodiment comprises a multi-channel laser driving circuit 302 comprising the drivers A(1), A(2), . . . and A(N) shown in FIG. 5. The input terminals IN+ and IN− of the laser driving apparatus 201 are configured to receive an input signal Input (e.g., a differential input signal). In this embodiment, the number of channels in the multi-channel laser driving circuit 302 can be two or more.

The multi-channel laser driving circuit 302 of the laser driving apparatus 201 shown in FIG. 6 comprises a first channel 3021, a second channel 3022 . . . and an $N^{th}$ channel 302N. The first channel 3021 comprises a first resistor R(1) and a first driver such as the driver A(1), and can be configured to generate a first driving signal (e.g., the driving current 41)) according to the input signal Input such as the modulation signal; the second channel 3022 comprises a second resistor R(2) and a second driver such as the driver A(2), and can be configured to generate a second driving signal (e.g., the driving current I(2)) according to the input signal Input such as the modulation signal; and the rest can be deduced by analogy, for example, the $N^{th}$ channel 302N comprises the $N^{th}$ resistor R(N) and the $N^{th}$ driver such as the driver A(N), and can be configured to generate the $N^{th}$ driving signal (e.g., the driving current I(N)) according to the input signal Input such as the modulation signal.

As shown in FIG. 6, the first channel 3021, the second channel 3022 . . . and the $N^{th}$ channel 302N are configured to receive the input signal Input such as the modulation signal, and respectively transmit the first driving signal (e.g., the driving current I(1)), the second driving signal (e.g., the driving current I(2)) . . . and the $N^{th}$ driving signal (e.g., the driving current I(N)). Based on the architecture shown in FIG. 6, the first driving signal (e.g., the driving current I(1)), the second driving signal (e.g., the driving current I(2)) . . . and the $N^{th}$ driving signal (e.g., the driving current I(N)) are configured to collectively drive the laser 10, where the total driving signal (e.g., the driving current I) is the summation of the first, the second . . . and the $N^{th}$ driving signals (e.g., the driving currents I(1), I(2) . . . and I(N)). Additionally, the first inductance L(1) on the current path corresponding to the first channel 3021, the second inductance L(2) on the current path corresponding to the second channel 3022 . . . and the $N^{th}$ inductance L(N) on the current path corresponding to the $N^{th}$ channel 302N represent parasitic inductances.

In addition, the first resistor R(1) is coupled between a first input terminal 3021A and a second input terminal 3021B of the first driver A(1) in the first channel 3021; the second resistor R(2) is coupled between a first input terminal 3022A and a second input terminal 3022B of the second driver A(2) in the second channel 3022; and the rest can be deduced by analogy, for example, the $N^{th}$ resistor R(N) is coupled between a first input terminal 302NA and a second input terminal 302NB of the $N^{th}$ driver A(N) in the $N^{th}$ channel 302N. Based on the architecture shown in FIG. 6, the first resistor R(1), the second resistor R(2) . . . and the $N^{th}$ resistor R(N) are coupled in parallel, and more particularly, can be designed to collectively generate an input impedance Req of the laser driving apparatus 201 (e.g., 50 ohm). For example, the first resistor R(1), the second resistor R(2) . . . and the $N^{th}$ resistor R(N) can be configured to perform the impedance-matching.

According to this embodiment, the first resistor R(1), the second resistor R(2) . . . and the $N^{th}$ resistor R(N) are configurable with respect to a channel count (e.g., N) of the laser driving apparatus 201 to make the input impedance Req of the laser driving apparatus 201 be equal to a predetermined impedance value (e.g. 50 ohm, or any of other impedance values based on certain requirements). More particularly, the first resistor R(1), the second resistor R(2) . . . and the $N^{th}$ resistor R(N) can be configurable with respect to the channel count (e.g., N) in response to a user command, to make the input impedance Req be equal to the predetermined impedance value. For example, the user command can represent a digital code received from outside of the laser driving apparatus 201. In one implementation, the user command can be represented by a digital code received from an internal component (e.g. register or memory) of the laser driving apparatus 201.

The channel count mentioned above can represent the total number of channels of the laser driving apparatus 201, such as the total number of the N channels comprising the first channel 3021, the second channel 3022 . . . and the $N^{th}$ channel 302N. For better comprehension, assume that the predetermined impedance value represents 50 ohm. Any resistor (e.g., each resistor) of the first resistor R(1), the second resistor R(2) . . . and the $N^{th}$ resistor R(N) can be implemented with a resistor bank. For example, the resistor bank comprises a set of resistors and a set of switches for enabling at least one portion (e.g., a portion or all) of the set of resistors, where the at least one portion of the set of resistors can be electrically coupled in series, and the set of switches can operate according to the user command, to make the resistor bank have a selected resistance value corresponding to the user command.

In some implementations, the first channel 3021, the second channel 3022 . . . and the $N^{th}$ channel 302N can be implemented in one chip, or the first channel 3021, the second channel 3022 . . . and the $N^{th}$ channel 302N can be implemented in different chips. In some implementations, the laser 10 can be edge-emitting laser or vertical-emitting laser (e.g., VCSEL). In one implementation, the input signal Input such as the modulation signal is a differential signal. For example, the differential signal is a set of clock signals (e.g., a first clock signal and a second clock signal) for being inputted into the input terminals IN+ and IN−, where one of the set of clock signals can be an inverted or reversed clock signal of the other clock signal.

According to some embodiments, the channel count (e.g., N) may vary. For example, when only one channel such as the first channel 3021 is required, the user command can be arranged to indicate that the channel count (e.g., the number of enabled resistors in the resistor bank) is equal to 1 and/or that the selected resistance value is equal to (50*1) ohm, so the laser driving apparatus 201 can configure the resistance value of the first resistor R(1) to be (50*1) ohm, and therefore make the input impedance Req be equal to the predetermined impedance value such as 50 ohm; when two channels such as the first channel 3021 and the second channel 3022 are required, the user command can be arranged to indicate that the channel count (e.g., the number of enabled resistors in the resistor bank) is equal to 2 and/or that the selected resistance value is equal to (50*2) ohm, so the laser driving apparatus 201 can configure the resistance value of each of the first resistor R(1) and the second resistor R(2) to be (50*2) ohm, and therefore make the input impedance Req be equal to the predetermined impedance value such as 50 ohm; and the rest can be deduced by analogy, for example, when N channels such as the first channel 3021, the second channel 3022 . . . and the $N^{th}$ channel 302N are required, the user command can be arranged to indicate that the channel count (e.g., the number of enabled resistors in the resistor bank) is equal to N and/or that the selected resistance value is equal to (50*N) ohm, so the laser driving apparatus 201 can configure the resistance value of each of the first resistor R(1), the second resistor R(2) . . . and the $N^{th}$ resistor R(N) to be (50*N) ohm, and therefore make the input impedance Req be equal to the predetermined impedance value such as 50 ohm.

According to some embodiments, the first driving signal (e.g., the driving current I(1)), the second driving signal (e.g., the driving current I(2)) . . . and the $N^{th}$ driving signal (e.g., the driving current I(N)) can be configured to drive multiple lasers, respectively.

Figure 7:
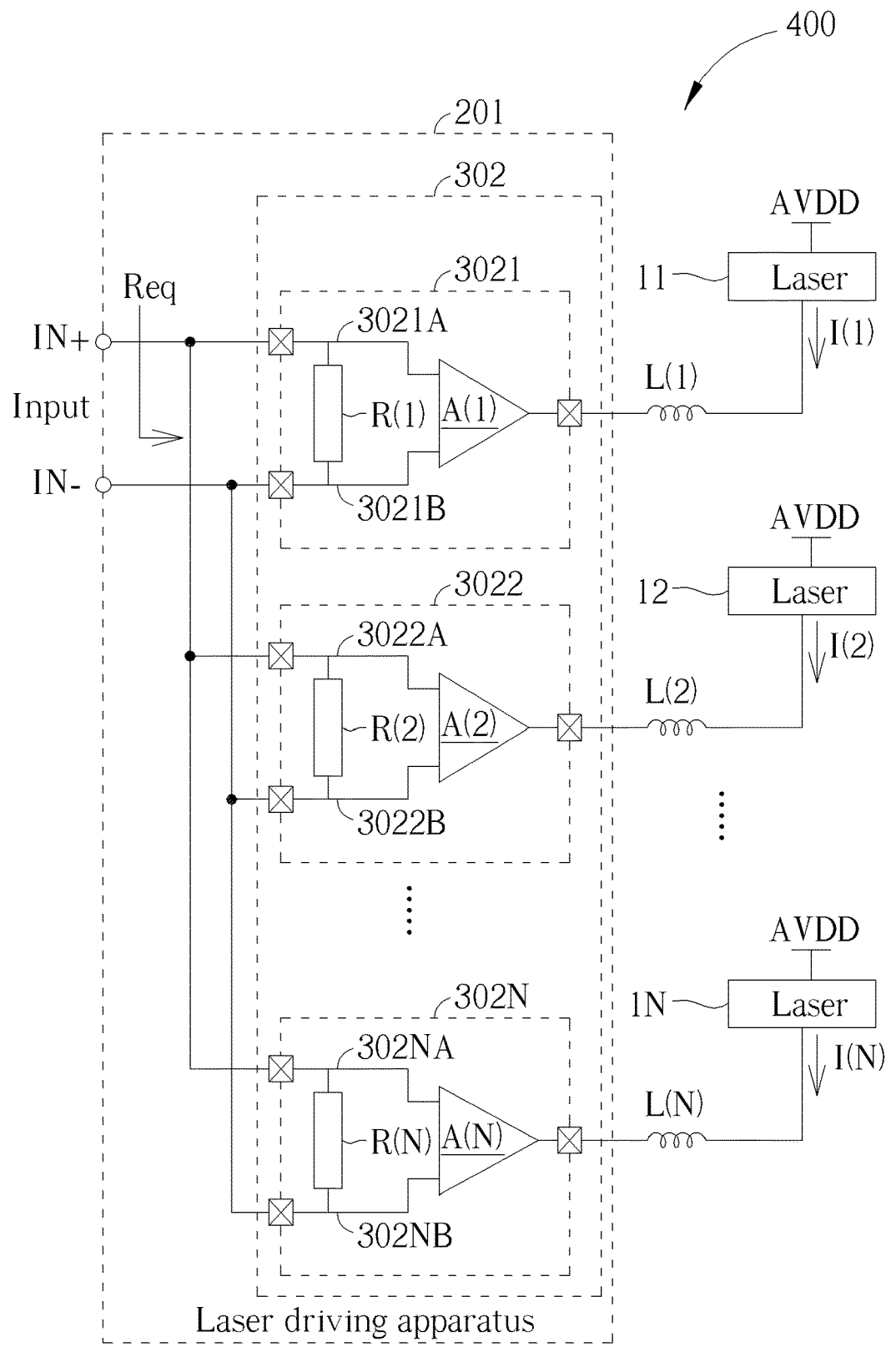
FIG. 7 is a light emitting apparatus according to an embodiment of the present application.

FIG. 7 is a light emitting apparatus 400 according to an embodiment of the present application. The light emitting apparatus 400 comprises the multiple lasers such as a first laser 11, a second laser 12, . . . and an $N^{th}$ laser IN, and further comprises the laser driving apparatus 201 shown in FIG. 6. In this embodiment, the number of channels in the multi-channel laser driving circuit 302 can be two or more. In comparison with the embodiment shown in FIG. 6, each channel of the multi-channel laser driving circuit 302 of this embodiment is configured to drive one laser. As shown in FIG. 7, the first channel 3021 is configured to transmit the first driving signal (e.g., the driving current I(1)) to the first laser 11, the second channel 3022 is configured to transmit the second driving signal (e.g., the driving current I(2)) to the second laser 12 . . . , and the $N^{th}$ channel 302N is configured to transmit the $N^{th}$ driving signal (e.g., the driving current I(N)) to the $N^{th}$ laser 1N. Under control of the laser driving apparatus 201, the first driving signal (e.g., the driving current I(1)), the second driving signal (e.g., the driving current I(2)) . . . and the $N^{th}$ driving signal (e.g., the driving current I(N)) can be configured to drive the first laser 11, the second laser 12, . . . and the $N^{th}$ laser 1N, respectively.

Based on the architecture shown in FIG. 7, the first resistor R(1), the second resistor R(2) . . . and the $N^{th}$ resistor R(N) are coupled in parallel, and more particularly, can be designed to collectively generate the input impedance Req of the laser driving apparatus 201 (e.g., 50 ohm). For example, the first resistor R(1), the second resistor R(2) . . . and the $N^{th}$ resistor R(N) can be configured to perform the impedance-matching. For brevity, similar descriptions for this embodiment are not repeated in detail here.

Figure 8:
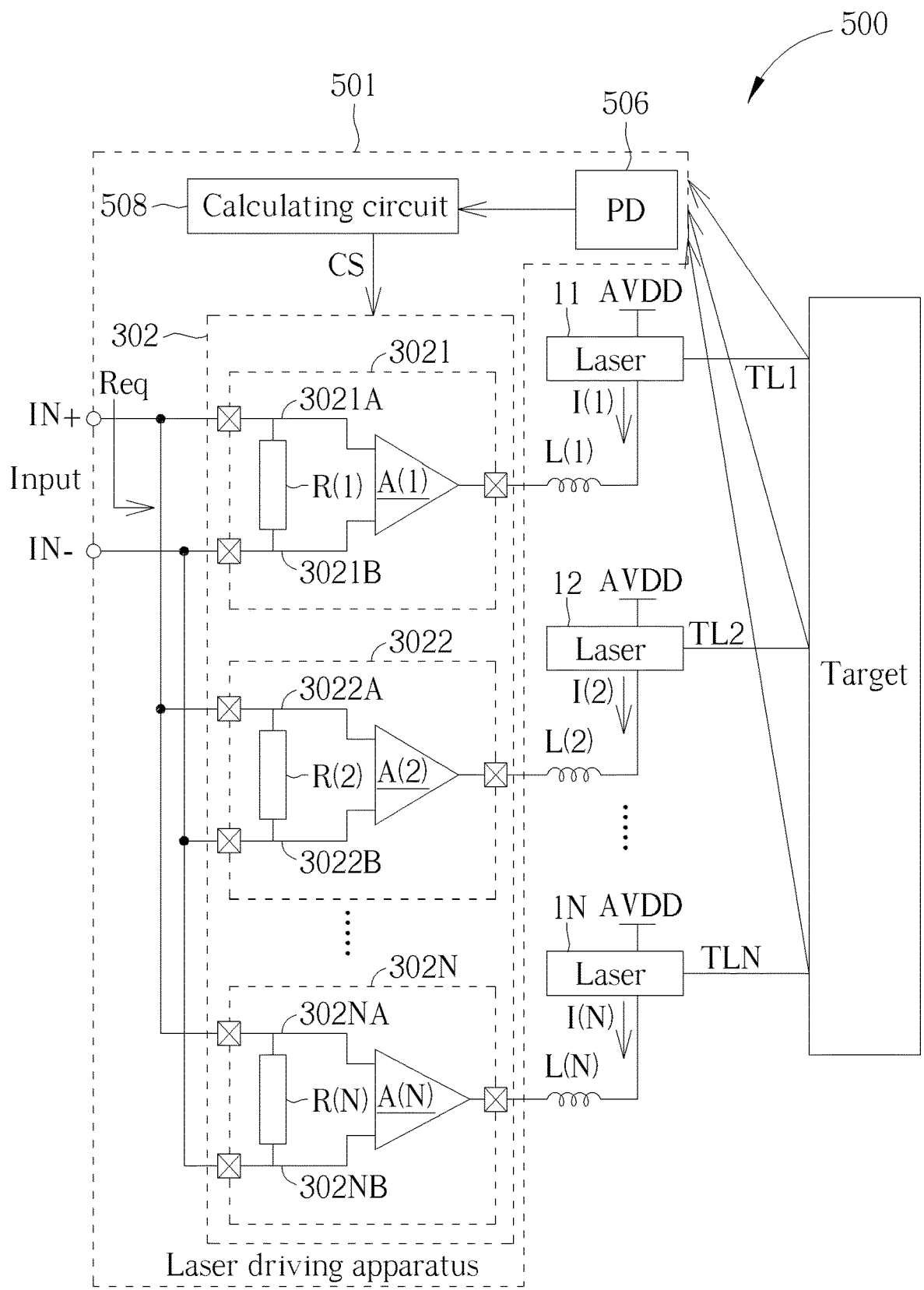
FIG. 8 is a light emitting apparatus according to an embodiment of the present application.

FIG. 8 is a light emitting apparatus 500 according to an embodiment of the present application. The light emitting apparatus 500 comprises the architecture shown in FIG. 7 and additional components. For example, the light emitting apparatus 500 comprises a laser driving apparatus 501, and the laser driving apparatus 501 comprises the multi-channel laser driving circuit 302 of the laser driving apparatus 201 shown in FIG. 7 and further comprises at least one photo-detector (PD) 506 and a calculating circuit 508. The PD 506 receives and detects a first light TL1 emitted by the first laser 11, a second light TL2 emitted by the second laser 12 . . . and an $N^{th}$ light TLN emitted by the second laser 1N, where these lights can be reflected from a target. The lights (e.g., TL1, TL2 . . . and TLN) emitted by the lasers (e.g., 11, 12 . . . and 1N) may have phase delay to each other. The calculating circuit 508 calculates at least one phase relationship between the first light TL1 emitted by the first laser 11, the second light TL2 emitted by the second laser 12 . . . and the $N^{th}$ light TLN emitted by the second laser 1N (e.g., the lights reflected from the target), and output a phase control signal CS to the multi-channel laser driving circuit 302 to control one or more channels of the first channel 3021, the second channel 3022 . . . and the $N^{th}$ channel 302N so that the first light TL1, the second light TL2 . . . and the $N^{th}$ light TLN can be synchronized. For example, the phase control signal CS can be configured to control (e.g., adjust) the signal delay (e.g., the phase delay) in the one or more channels through the phase delay circuit 108 in each one or more drivers (e.g. one or more of the drivers A(1), A(2), . . . and A(N)) of the one or more channels. In one implementation, during the synchronization process, the emitted lights (e.g., TL1, TL2 . . . and TLN) can be emitted in different time frame. In one implementation, during the synchronization process, the emitted lights (e.g., TL1, TL2 . . . and TLN) can be emitted at the same time.

Figure 9:
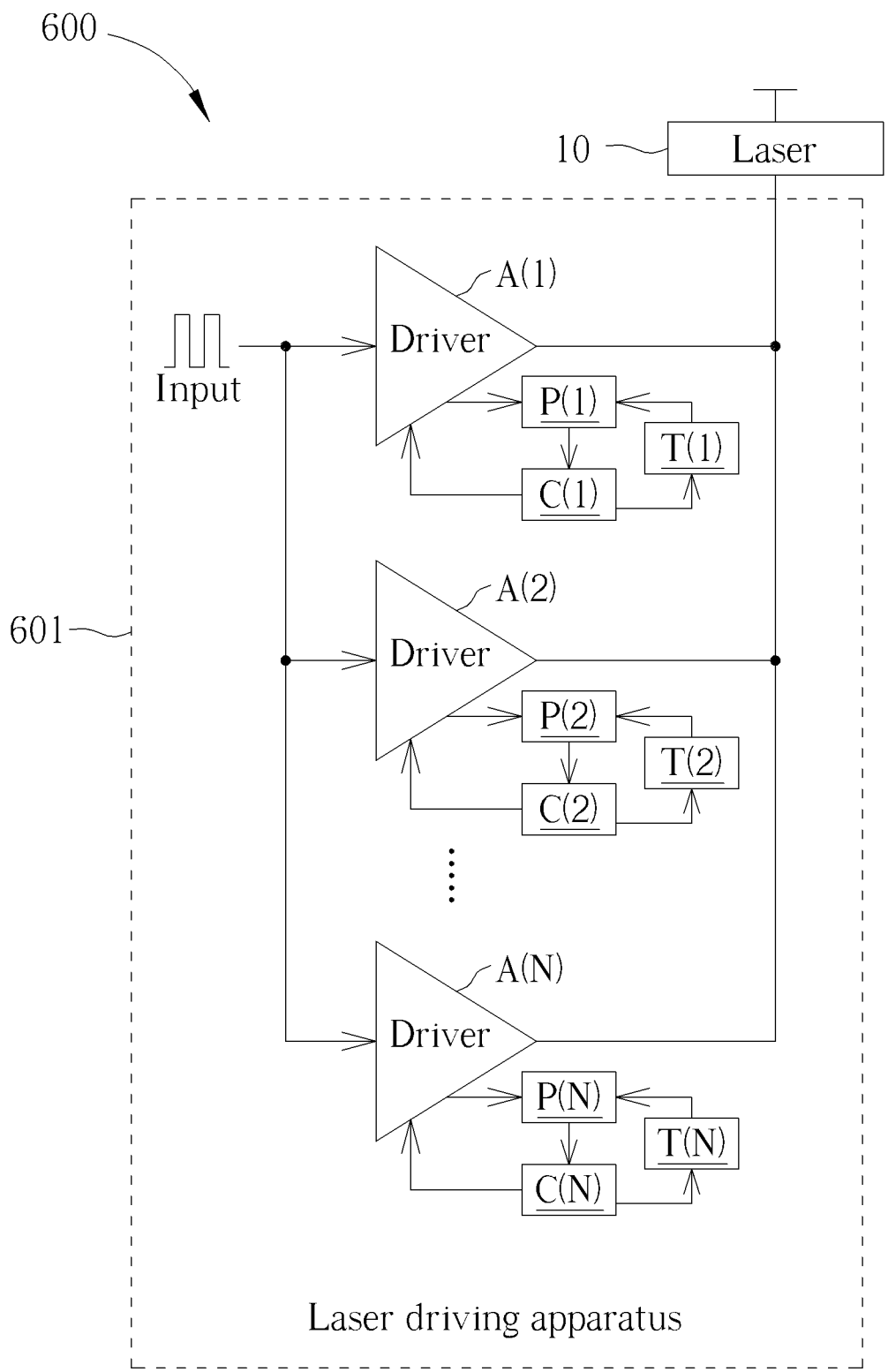
FIG. 9 is a light emitting apparatus according to an embodiment of the present application.

FIG. 9 is a light emitting apparatus 600 according to an embodiment of the present application. The light emitting apparatus 600 comprises the laser 10 shown in FIG. 1 and a laser driving apparatus 601 having the current control circuitry and the multi-channel circuitry. The laser driving apparatus 601 comprises the multiple drivers A(1), A(2), . . . and A(N) respectively corresponding to the N channels as shown in FIG. 5, and further comprises the associated components regarding the current control in each of these channels as shown in FIG. 1. For example, any tracking circuit (e.g., each tracking circuit) of the multiple tracking circuits T(1), T(2), . . . and T(N) can be implemented according to the tracking circuit 101T, and more particularly, can have the same circuit architecture and the same functionality as that of the tracking circuit 101T; any comparator (e.g., each comparator) of the multiple comparators P(1), P(2), . . . and P(N) can be implemented according to the comparator 101P, and more particularly, can have the same circuit architecture and the same functionality as that of the comparator 101P; and any control circuit (e.g., each control circuit) of the multiple control circuits C(1), C(2), . . . and C(N) can be implemented according to the control circuit 101C, and more particularly, can have the same circuit architecture and the same functionality as that of the control circuit 101C. For brevity, similar descriptions for this embodiment are not repeated in detail here.

According to some embodiments, the multiple control circuits C(1), C(2), . . . and C(N) can be integrated into the same circuit, and more particularly, can be integrated into the control circuit 101C.

According to some embodiments, at least one control circuit (e.g., one or more control circuits such as the control circuit 101C or the multiple control circuits C(1), C(2), . . . and C(N)) can be configured to set the first resistor R(1), the second resistor R(2) . . . and the $N^{th}$ resistor R(N) according to the user command, to make the input impedance Req be equal to the predetermined impedance value.

Based on the architecture of any of the embodiments respectively shown in FIGS. 5-9, the laser driving apparatus (e.g., 201, 501 and 601) can properly drive at least one laser (e.g., one or more lasers such as the laser 10 or the lasers 11, 12 . . . and 1N), for example, by utilizing the multi-channel laser driving circuit 302, where each channel has its own resistor (e.g. the resistor bank mentioned above) for the impedance matching and has its own driver for transmitting the corresponding driving signal. With the configurations as described in these embodiments, the signal reflection at the input of the laser driving apparatus can be reduced, and the effects of parasitic inductance and/or parasitic capacitance which may occur at the output of the laser driving apparatus can be reduced as well. On the other hands, the laser driving apparatus can enable or disable the channel(s) such as one or more of the multiple channels to control the power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A laser driving apparatus, comprising:
 a driver, comprising:
  a laser driving circuit, configured to generate a driving current to drive a laser;
 a tracking circuit, comprising:
  a reference current source, configured to generate a reference current as a reference for the laser driving apparatus; and
  a replica circuit, corresponding to at least a portion of the laser driving circuit, configured to generate a sensing current according to the reference current;
 a comparator, electrically coupled to the laser driving circuit and the replica circuit, configured to compare a first voltage on the laser driving circuit and a second voltage on the replica circuit to generate a comparison signal; and a control circuit comprising a digital circuit, the control circuit configured to adjust the sensing current in a first operating mode and the driving current in a second operating mode, the control circuit configured to receive the comparison signal and generate a digital code to adjust the sensing current or the driving current according to the comparison signal.

2. The laser driving apparatus of claim 1, wherein the replica circuit has a circuit the same as the laser driving circuit.

3. The laser driving apparatus of claim 1, wherein the control circuit is configured to adjust the sensing current in a detection mode.

4. The laser driving apparatus of claim 1, wherein the control circuit is configured to adjust the driving current in a calibration mode.

5. The laser driving apparatus of claim 1, wherein the tracking circuit further comprises:
at least one first transistor, positioned on a current path of the replica circuit, configured to perform current adjustment;
wherein the control circuit is configured to generate a first adjusting signal to control the first transistor so as to adjust the sensing current.

6. The laser driving apparatus of claim 1, wherein the laser driving circuit comprises:
at least one second transistor, positioned on a current path of the laser driving circuit, configured to perform current adjustment;
wherein the control circuit is configured to generate a second adjusting signal to control the second transistor so as to adjust the driving current.

7. The laser driving apparatus of claim 6, wherein the driver further comprises:
at least one switch, electrically coupled to the at least one second transistor, configured to control the second transistor according to the second adjusting signal so as to adjust the driving current.

8. The laser driving apparatus of claim 1, further comprising:
a low-dropout regulator, configured to regulate a voltage to generate a regulated voltage, for providing power to the driver;
wherein the control circuit is configured to generate a third adjusting signal to control the low-dropout regulator so as to adjust the driving current.

9. The laser driving apparatus of claim 1, wherein the driver further comprises:
a phase delay circuit, configured to control signal delay of an input signal of the driver;
wherein the input signal of the driver is a modulation signal and inputted into the laser driving circuit through the phase delay circuit.

10. A laser driving apparatus, comprising:
a first channel, configured to generate a first driving signal according to a modulation signal, comprising a first resistor and a first driver; and
a second channel, configured to generate a second driving signal according to the modulation signal, comprising a second resistor and a second driver;
wherein, the first resistor and the second resistor are coupled in parallel; and wherein any channel of multiple channels comprising the first and the second channels comprises a laser driving circuit and a control circuit comprising a digital circuit, the control circuit configured to adjust a sensing current in a first operating mode and a driving current in a second operating mode, the sensing current generated by a replica circuit that corresponds to at least a portion of the laser driver circuit, the control circuit configured to receive a comparison signal and generate a digital code to adjust the sensing current or the driving current according to the comparison signal.

11. The laser driving apparatus of claim 10, wherein the first resistor and the second resistor are configurable with respect to a channel count of the laser driving apparatus to make an input impedance of the laser driving apparatus equal to a predetermined impedance value.

12. The laser driving apparatus of claim 11, wherein the first resistor and the second resistor are configurable with respect to the channel count in response to a user command, to make the input impedance equal to the predetermined impedance value.

13. The laser driving apparatus of claim 11, wherein the channel count represents a total number of channels of the laser driving apparatus, and the channels comprises the first channel and the second channel.

14. The laser driving apparatus of claim 11, wherein the predetermined impedance value is 50 ohm.

15. The laser driving apparatus of claim 10, wherein the first driving signal and the second driving signal are configured to collectively drive a laser.

16. The laser driving apparatus of claim 10, wherein the first driving signal and the second driving signal are configured to drive a first laser and a second laser, respectively.

17. The laser driving apparatus of claim 16, further comprising:
a calculating circuit, configured to calculate a phase relationship between a first light emitted by the first laser and a second light emitted by the second laser, and output a phase control signal to control one or more of the first channel and the second channel.

18. The laser driving apparatus of claim 10, wherein an input impedance of the laser driving apparatus is 50 ohm.

19. The laser driving apparatus of claim 10, wherein any channel of multiple channels comprising the first and the second channels comprises:
a driver, comprising:
the laser driving circuit, configured to generate a driving current to drive a laser;
a tracking circuit, comprising:
a reference current source, configured to generate a reference current as a reference for the laser driving apparatus; and
the replica circuit, which generates the sensing current according to the reference current; and
a comparator, electrically coupled to the laser driving circuit and the replica circuit, configured to compare a first voltage on the laser driving circuit and a second voltage on the replica circuit to generate the comparison signal.

* * * * *